United States Patent [19]

Shimbo et al.

[11] Patent Number: 4,638,552
[45] Date of Patent: Jan. 27, 1987

[54] METHOD OF MANUFACTURING SEMICONDUCTOR SUBSTRATE

[75] Inventors: Masaru Shimbo; Kiyoshi Fukuda; Yoshiaki Ohwada, all of Yokohama, Japan

[73] Assignee: Kabushiki Kaisha Toshiba, Kawasaki, Japan

[21] Appl. No.: 701,516

[22] Filed: Feb. 14, 1985

[30] Foreign Application Priority Data

May 9, 1984 [JP] Japan .................................. 59-92442
May 9, 1984 [JP] Japan .................................. 59-92443

[51] Int. Cl.$^4$ .................... H01L 21/302; H01L 21/76
[52] U.S. Cl. ............................... 29/576 J; 29/576 W; 29/580; 65/59.3; 148/175; 148/DIG. 12; 148/DIG. 159; 156/273.9; 357/49; 357/50; 357/55
[58] Field of Search ................. 29/576 W, 580, 576 J; 148/174, 175, DIG. 12, DIG. 159; 65/40, 59.3; 156/273.9; 204/16; 357/49, 50, 55

[56] References Cited

U.S. PATENT DOCUMENTS

| | | | |
|---|---|---|---|
| 3,239,908 | 3/1966 | Nakamura | 148/DIG. 12 |
| 3,332,137 | 7/1967 | Kenney | 357/55 X |
| 3,355,636 | 11/1967 | Becke et al. | 148/DIG. 12 |
| 4,103,273 | 7/1978 | Keller | 29/580 X |
| 4,169,000 | 9/1979 | Riseman | 29/576 W |
| 4,291,293 | 9/1981 | Yamada et al. | 338/4 |
| 4,317,091 | 2/1982 | Dahlberg | 357/55 X |
| 4,426,768 | 1/1984 | Black et al. | 29/580 X |
| 4,441,115 | 4/1984 | Dahlberg | 357/55 X |
| 4,501,060 | 2/1985 | Frye et al. | 29/576 J |

FOREIGN PATENT DOCUMENTS 42-425  1/1967  Japan .

Primary Examiner—William G. Saba
Attorney, Agent, or Firm—Oblon, Fisher, Spivak, McClelland, & Maier

[57] ABSTRACT

A method of manufacturing a semiconductor substrate having a modified layer therein comprises the steps of mirror-polishing one surface of each of first and second semiconductor plates, forming a modified layer on at least one of the polished surfaces of the first and second semiconductor plates, and bonding the polished surfaces of the first and second semiconductor plates with each other in a clean atmosphere.

15 Claims, 16 Drawing Figures

METHOD OF MANUFACTURING SEMICONDUCTOR SUBSTRATE

BACKGROUND OF THE INVENTION

The present invention relates to a method of manufacturing a semiconductor substrate in which a modified layer such as an impurity layer or dielectric layer is buried.

In semiconductor devices, in order to form a pn junction or an insulating layer, a semiconductor substrate is locally modified by an impurity diffusion or oxidation technique. Also, a metal, insulating material, semiconductor material or the like is deposited or grown on a semiconductor substrate by various thin film formation techniques. However, these techniques are generally used for diffusing an impurity from a surface of the semiconductor substrate into a portion inside thereof or depositing a thin film thereon. For this reason, it is difficult to bury a modified layer in the semiconductor substrate by these techniques.

For example, a method wherein oxygen is ion-implanted in a silicon substrate which is then annealed so as to form an oxide layer therein is known. However, in this method, when the oxide layer is buried in a deep portion of the silicon substrate, the silicon substrate is considerably damaged. In addition, since margins for ion implantation dose and depth control are small, it is very difficult to bury the oxide layer of a predetermined thickness precisely at a predetermined depth of the substrate.

Many devices, such as a bipolar IC, require a buried layer of a conductivity type and an impurity concentration different from those of the substrate. FIG. 1 shows a normal bipolar IC as an example of such a device. A manufacturing process of the bipolar IC is as follows. An $n^+$-type layer 12 as a prospective collector buried layer is formed in a p-type silicon substrate 11 by selective diffusion. An $n^-$-type layer 13 is formed on the substrate 11 by an epitaxial growth method. A p-type base region 14 and an $n^+$-type source region 15 are sequentially formed in the $n^-$-type layer 13 by a diffusion or ion-implantation method so as to obtain a bipolar transistor. Reference numeral 16 denotes a $p^+$-type diffusion layer for element isolation; and 17, an $n^+$-type diffusion region for a collector electrode.

According to such a conventional method of manufacturing the bipolar IC, the depth of the buried layer is determined by the thickness of the epitaxial layer 13. However, the epitaxial growth method is limited by its growth speed, since it takes a considerably long period of time to obtain a thick epitaxial layer. In addition, since the epitaxial growth method requires high skill and is difficult to control, defects and the like are easily formed in the epitaxial layer 13. In the epitaxial method requiring a long period of time, since an impurity in the buried layer 12 is redistributed, the depth of the buried layer 12, i.e., the thickness of the epitaxial layer 13 on the buried layer 12 is difficult to control.

In this manner, a structure of a semiconductor device is undesirably limited, and new techniques must be developed in order to realize a device design which satisfies requirements for device characteristics. Therefore, demand for a technique for burying a modified layer such as an impurity layer and an insulating layer in a semiconductor substrate with a simple process and high controllablity has arisen.

SUMMARY OF THE INVENTION

It is an object of the present invention to provide a method of manufacturing a semiconductor substrate in which a modified layer can be buried in a semiconductor substrate with a simple process and high controllability.

The present invention utilizes a method in which two semiconductor substrates are directly bonded so as to obtain one semiconductor substrate. Such a method in which an impurity layer having an impurity different from that of a semiconductor body by bonding two semiconductor bodies is well known as an alloy-type semiconductor bonding method. However, this method is not currently used. The reason is that, in this method, since the semiconductor bodies must be heated to a high temperature near a melting point of a semiconductor material and pressed at a high pressure, many undesirable crystal defects occur in the semiconductor body.

The present inventors found that if surfaces of semiconductor plates were sufficiently mirror-polished and the polished surfaces thereof were bonded to each other in a clean atmosphere, a strong bonded structure could be obtained. They also found that when the bonded structure was subjected to a thermal treatment at a temperature of 200° C. or higher, a bonding strength thereof was increased. Although this bonding mechanism is not fully understood, it is surmised that a natural oxide film formed on the polished surface plays an important roll in bonding. The present invention is made based on this finding.

According to a first embodiment of the present invention, there is provided a method of manufacturing a semiconductor substrate having a modified layer therein, comprising the steps of:

mirror-polishing one surface of each of first and second semiconductor plates;

forming a modified layer in at least one of the polished surfaces of the first and second semiconductor plates; and bonding the polished surfaces of the first and second semiconductor plates with each other in a clean atmosphere.

A p-type or an n-type silicon substrate can be used as the first and second semiconductor plates in the method of the present invention. Mirror-polishing is preferably performed with an optical polishing process. A roughness of the polished surfaces of the semiconductor plates is preferably 500 Å or less. Note that "surface roughness" is given by a maximum height (Rmax) defined in JIS B-0601 (1982).

The modified layer can be formed in one or both of the polished surfaces of the semiconductor plates. The modified layer can be an impurity layer formed by impurity diffusion of As, B, P or the like, and an oxide layer formed by thermal oxidation.

An atmosphere containing a foreign substance in an amount of 20 particles/$m^3$ or less is preferable as the clean atmosphere in which the polished surfaces of the semiconductor plates are bonded. Such an atmosphere can be realized in a clean room.

The bonded structure obtained by bonding the polished surfaces of the semiconductor plates is heated to a temperature of 200° C. or higher in order to increase a bonding strength thereof. A heating temperature preferably falls within the range between 200° and 1,300° C.

According to a second embodiment of the present invention, there is provided a method of manufacturing a semiconductor substrate having a modified layer therein, comprising the steps of:

mirror-polishing one surface of each of first and second semiconductor plates;

forming at least one groove in at least one of the polished surfaces of the first and second semiconductor plates, the groove opening to end faces of the semiconductor plate;

bonding the polished surfaces of the first and second semiconductor plates in a clean atmosphere so as to obtain a bonded structure; and placing the bonded structure in an atmosphere containing a semiconductor modifying gas so as to form a modified layer in and around the groove.

Conditions for polishing and bonding are the same as those of the first embodiment. The groove can be formed into a desired pattern by etching. The modified layer can be formed along the groove by heating the bonded structure in a predetermined atmosphere containing an impurity such as oxygen, nitrogen or the like. When an oxide layer is formed along the groove in an oxygen atmosphere, the groove can be closed by the oxide layer due to a volume expansion thereof. When the groove is not closed, a space remains in the substrate. The space can be used as a passage for a cooling medium in a power transistor and the like.

In the second embodiment, the groove is needed for forming the modified layer. Also, when the semiconductor plates are bonded, the groove can prevent air bubbles from remaining between the semiconductor plates. If air bubbles remain between bonded surfaces, a high bonding strength cannot be obtained.

Note that in either embodiments of the present invention, after polishing, the polished surface is preferably washed by water, a surfactant, an organic solvent, an acid solution or the like in order to remove fine particles, adsorbed ions, organic and inorganic materials and the like.

DETAILED DESCRIPTION OF THE PREFERRED EMBODIMENT

The present invention will be described in more detail by way of examples.

EXAMPLE 1

In this Example, the present invention is utilized for forming an impurity buried layer of a bipolar IC, and will be described with reference to FIGS. 2A to 2E.

Figure 1:
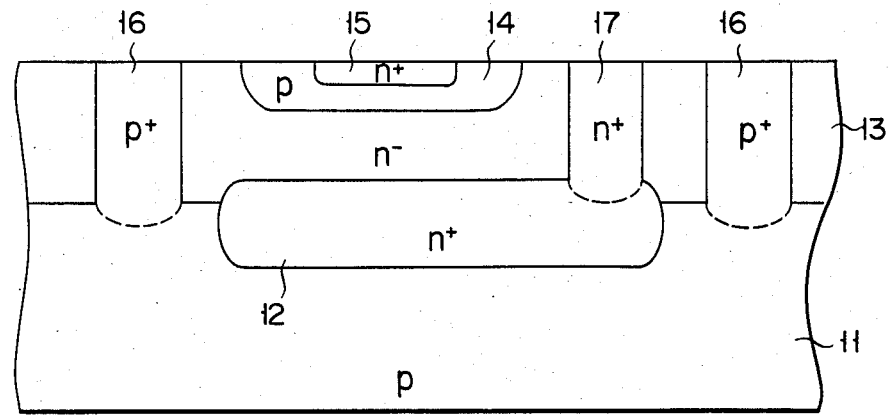
FIG. 1 is a sectional view showing a conventional structure of a bipolar IC.
Figure 2A:
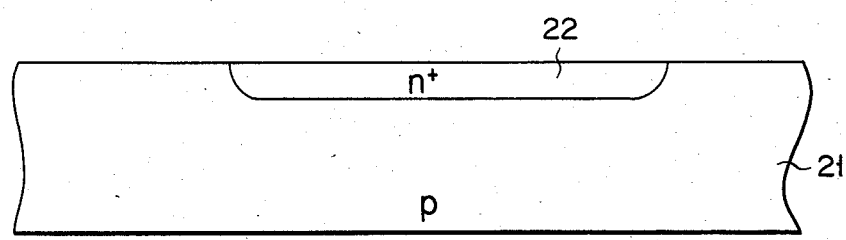
FIGS. 2A to 2E are sectional views showing a manufacturing method of a bipolar IC according to an embodiment of the present invention.
Figure 2B:
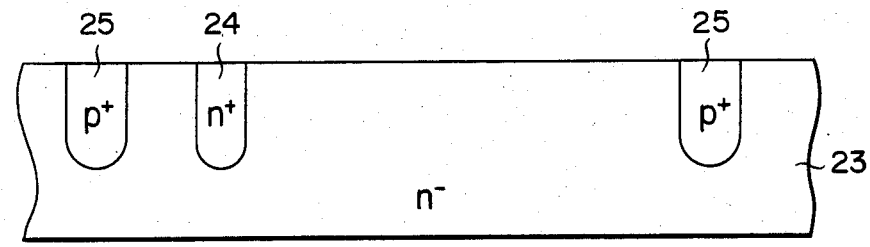
Figure 2C:
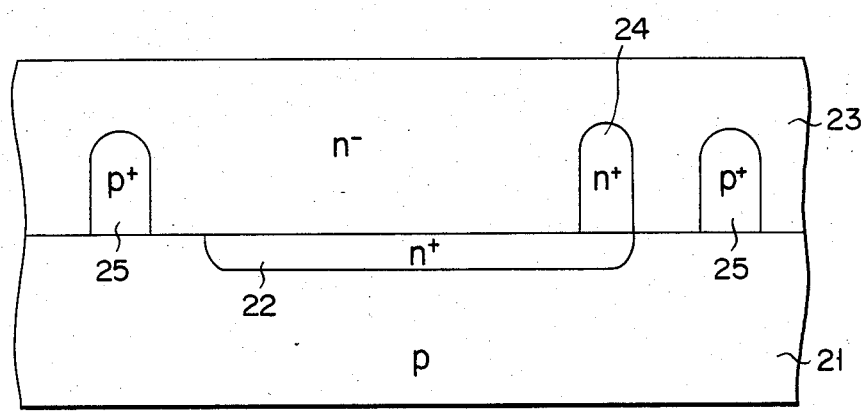

As shown in FIG. 2A, an $n^+$-type impurity was selectively diffused in a surface of a p-type silicon substrate 21 so as to form an $n^+$-type layer 22. In this case, the surface of the substrate 21 had been optically polished so as to have a surface roughness of 200 Å. The $n^+$-type layer 22 serves as a prospective collector buried layer.

An $n^+$-type layer 24 as a prospective collector electrode region and a $p^+$-type layer 25 as an element isolation region were formed by impurity diffusion in a surface of an $n^-$-type silicon substrate 23 which had been polished in the same manner as the substrate 21.

These substrates 21 and 23 were washed well with water and dried. Thereafter, the polished surfaces of the substrates 21 and 23 were bonded to each other in a clean atmosphere containing no foreign substances such that the $n^+$-type layers 22 and 24 faced each other, thus obtaining a bonded structure shown in FIG. 2C. The bonded structure had a high bonding strength of 5 kg/cm$^2$ without any further thermal treatment. Note that when the bonded structure was subjected to a thermal treatment at a temperature of 1,000° C., a still high bonding strength of 150 kg/cm$^2$ could be obtained.

Figure 2D:
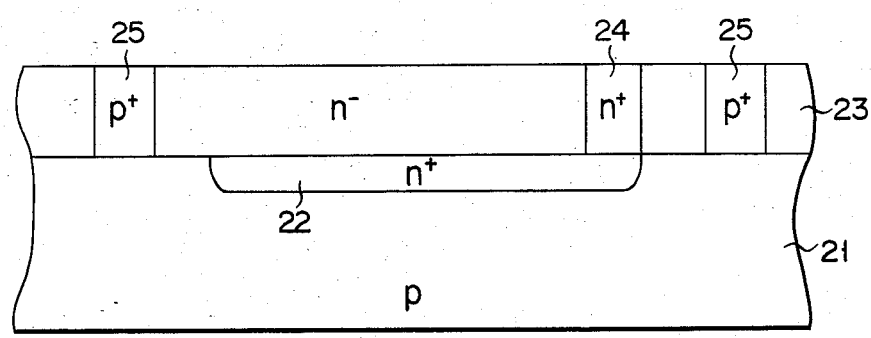
Figure 2E:
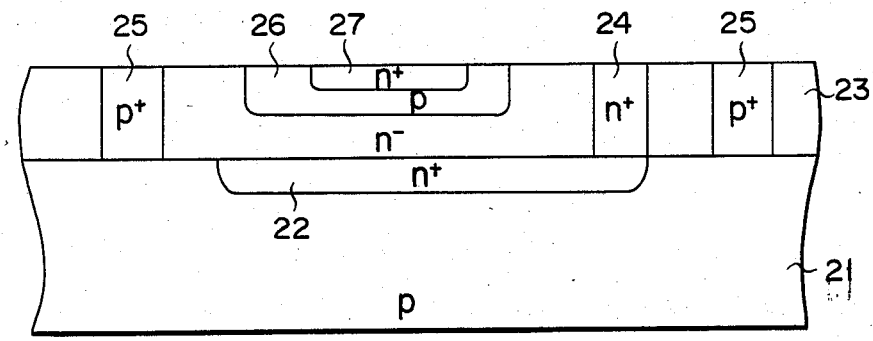

In this manner, an IC substrate in which the $n^+$-type layer 22 is buried and the $n^+$-type layer 24 connected to the $n^+$-type layer 22 and the $n^+$-type layer 25 are formed, can be obtained. Although this substrate can be used for manufacturing ICs without further modification, a thickness thereof can be adjusted by polishing or etching as needed, as shown in FIG. 2D. Thereafter, as shown in FIG. 2E, a p-type base region 26 and an n-type emitter region 27 were formed in the resultant structure so as to obtain a bipolar IC.

According to Example 1 described above, a bipolar IC having satisfactory device characteristics can be easily obtained without using an epitaxial substrate. In addition, since a thermal treatment does not require high temperatures, impurity redistribution from the buried impurity layer can be minimized. For this reason, a depth and a concentration of the buried insulating layer can be set with high controllability.

In Example 1, an impurity layer having a high concentration is formed in the substrate. However, the present invention is not limited to this. For example, a buried layer of a conductivity type or an impurity concentration different from those in Example 1 can be formed in the substrate. In addition, element isolation can be performed by forming an insulating layer such as an oxide layer in place of an impurity layer.

EXAMPLE 2

In this Example, the present invention is applied to a process for manufacturing a silicon substrate having an oxide layer therein.

Figure 3A:
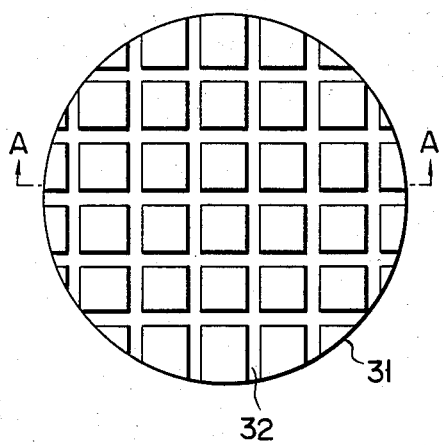
FIGS. 3A and 4A are plan views and FIGS. 3B, 4B, 5 and 6 are sectional views respectively showing a manufacturing method of a silicon substrate according to another embodiment of the present invention.
Figure 4A:
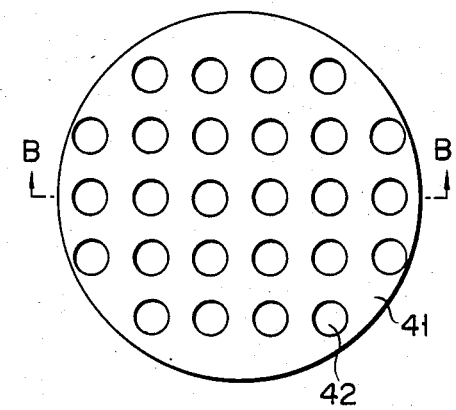
Figure 3B:
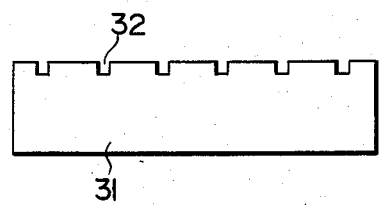
Figure 4B:
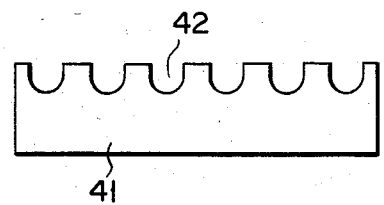
Figure 5:
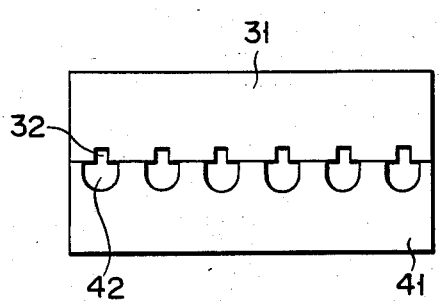

FIG. 3A is a plan view of a first silicon substrate 31, and FIG. 3B is a sectional view taken along a line A—A thereof. A surface of the substrate 31 is optically polished to have a surface roughness of 300 Å, and a plurality of grooves 32 open to end faces of the substrate 31 are formed in a lattice pattern on the surface thereof by etching. FIG. 4A shows a plan view of a second substrate 41, and FIG. 4B is a sectional view taken along a line B—B thereof. A surface of the substrate 41 is also polished by optical polishing so as to have a surface roughness of 300 Å. A plurality of holes 42 corresponding in number to the grooves 32 of the first silicon substrate 31 are formed in the surface of the substrate 41 by etching. These substrates were washed well with water and dried. Thereafter, the polished surfaces of the substrates 31 and 41 were bonded to each other so that the grooves 32 corresponded with the holes 42, thus obtaining a bonded structure 61, as shown in FIG. 5.

The bonded structure is preferably subjected to a thermal treatment at a temperature of 200° C. or higher, more preferably 1,000° C. in order to increase a bonding strength thereof. However, in this embodiment, a thermal treatment for forming an oxide film is commonly performed for the above thermal treatment.

Figure 6:
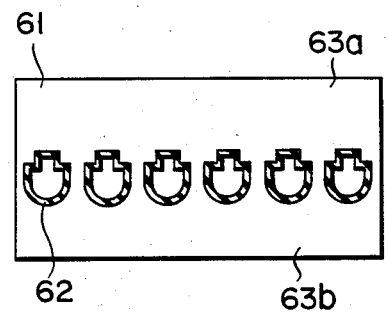

In other words, when the bonded structure 61 is heated in an oxygen atmosphere at a temperature of 1,200° C., an oxide film 62 can be formed on respective inner walls of the grooves 32 and the holes 42, as shown in FIG. 6.

In this manner, according to this example, a silicon substrate in which the oxide film 62 is buried can be easily manufactured. The silicon substrate 61 can be used as a normal IC substrate in which the oxide film 62 is used as an element isolation region. When thermal oxidation is performed for a long period of time or the number of grooves is increased so as to obtain a structure in which first and second substrate portions 63a and 63b are electrically isolated from each other, the substrate 61 can be used as a multilayer structure IC substrate. Furthermore, when the substrate 61 is used as that of a power semiconductor device, the device can be cooled by flowing a cooling medium in the grooves 32.

In this example, although the holes 42 are formed in the polished surface of the second silicon substrate 41, these holes are not always needed. Grooves having the same pattern as that of the grooves 32 formed in the polished surface of the first substrate 31 can be formed instead of the holes 42.

In Example 2, the oxide film is buried in the substrate. However, the present invention is not limited to this. For example, an impurity layer can be formed along the grooves in an impurity atmosphere in place of the oxygen atmosphere. Also, a nitride film can be formed along the grooves in a nitrogen atmosphere.

EXAMPLE 3

In this Example, a manufacturing method described in Example 2 is applied to a specific method of manufacturing a one-chip module in which a high power driving element and a control element are formed on a single substrate.

Figure 7A:
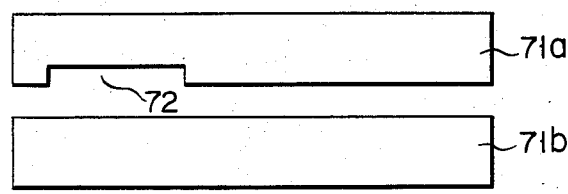
FIGS. 7A to 7D are sectional views showing a manufacturing method of a semiconductor device according to still another embodiment of the present invention.
Figure 7B:
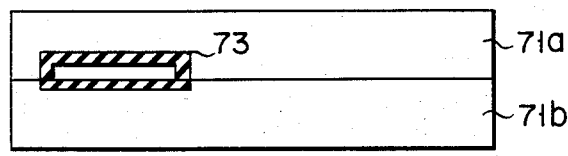

As shown in FIG. 7A, an n⁻-type first silicon substrate 71a whose polished surface has a wide groove 72 and an n⁺-type second silicon substrate 71b having a polished surface were prepared. As shown in FIG. 7B, these polished surfaces of the substrates 71a and 71b were brought into tight contact with each other and bonded. The resultant structure was heated in an oxygen atmosphere so as to form an oxide film 73 on an inner wall of the groove 72.

Figure 7C:
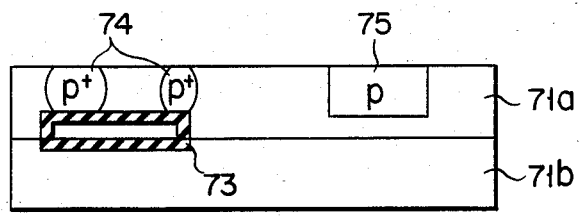
Figure 7D:
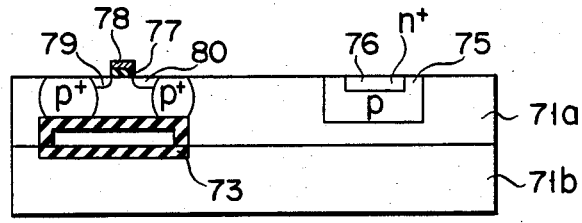

Thereafter, as shown in FIG. 7C, a p-type impurity was locally diffused into the oxide film 73 in the first silicon substrate portion 71a, thereby forming a p⁺-type isolation region 74. Simultaneously with or separately from this diffusion step, a p-type impurity was diffused in a portion of the first silicon substrate portion 71a excluding the groove 72, thereby forming a base region 75 for a driving transistor. Subsequently, as shown in FIG. 7D, an emitter region 76 was formed in the base region 75, thereby forming a driving transistor. Furthermore, a gate electrode 78, a source region 79, and drain region 80 were formed on a region isolated by the p⁺-type region 74 through a gate oxide film 77, thus forming a control MOS transistor.

According to this example, an npn transistor and a MOS transistor which is electrically isolated therefrom can be formed adjacent to each other on a single substrate.

What is claimed is:
1. A method of manufacturing a semiconductor substrate having a modified layer therein, comprising the steps of:
mirror-polishing one surface of each of first and second semiconductor plates;
forming a modified layer on at least one of the polished surfaces of said first and second semiconductor plates; and
bonding the polished surfaces of said first and second semiconductor plates with each other in a clean atmosphere without thermal fusing of said first and second semiconductor plates.

2. A method according to claim 1, wherein the step of mirror-polishing is performed by optical polishing.

3. A method according to claim 1, wherein a roughness of the polished surface is not more than 500 Å.

4. A method according to claim 1, wherein the polished surface is washed before bonding with at least one member selected from the group consisting of water, an organic solvent and an acid solution.

5. A method according to claim 1, wherein said modified layer is an impurity layer formed by impurity diffusion.

6. A method according to claim 1, wherein said modified layer is an oxide layer formed by thermal oxidation.

7. A method according to claim 1, wherein the clean atmosphere is an atmosphere which contains a foreign substance in an amount of not more than 20 particles/m³.

8. A method according to claim 1, further comprising the step of heating a bonded structure of said first and second semiconductor plates to a temperature of not lower than 200° C.

9. A method of manufacturing a semiconductor substrate having a modified layer therein, comprising the steps of:
mirror-polishing one surface of each of first and second semiconductor plates;
forming at least one groove in at least one of the polished surfaces of said first and second semiconductor plates, the groove opening to end faces of the semiconductor plate;
bonding the polished surfaces of said first and second semiconductor plates in a clean atmosphere so as to obtain a bonded structure; and
placing said bonded structure in an atmosphere containing a semiconductor modifying gas so as to form a modified layer in and around said groove.

10. A method according to claim 9, wherein the step of mirror-polishing is performed by optical polishing.

11. A method according to claim 9, wherein a roughness of the polished surface is not more than 500 Å.

12. A method according to claim 9, wherein the polished surface is washed before bonding with at least one member selected from the group consisting of water, a surfactant, an organic solvent and an acid solution.

13. A method according to claim 9, wherein the semiconductor modifying gas is an impurity gas, and said modified layer is an impurity layer.

14. A method according to claim 9, wherein the semiconductor modifying gas is oxygen gas, and said modified layer is an oxide layer.

15. A method according to claim 9, wherein the clean atmosphere is an atmosphere which contains a foreign substance in an amount of not more than 20 particles/m³.

* * * * *